(12) United States Patent
Finot (10) Patent No.: US 7,570,675 B2
(45) Date of Patent: Aug. 4, 2009

(54) LIQUID CRYSTAL POLYMER OPTICAL FILTER CARRIER

(75) Inventor: Marc A. Finot, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 11/844,129

(22) Filed: Aug. 23, 2007

(65) Prior Publication Data

US 2007/0291800 A1    Dec. 20, 2007

Related U.S. Application Data

(62) Division of application No. 11/171,532, filed on Jun. 30, 2005, now Pat. No. 7,280,181.

(51) Int. Cl.
*H01S 3/10* (2006.01)
(52) U.S. Cl. .............. 372/20; 372/98; 349/198
(58) Field of Classification Search ............ 372/20, 372/98; 349/198
See application file for complete search history.

(56) References Cited

U.S. PATENT DOCUMENTS

| | | | |
|---|---|---|---|
| 4,904,063 A | 2/1990 | Okada et al. | |
| 5,529,741 A | 6/1996 | Rubin et al. | |
| 5,843,539 A | 12/1998 | Harvey et al. | |
| 5,937,115 A | 8/1999 | Domash | |
| 6,320,257 B1 | 11/2001 | Jayaraj et al. | |
| 6,585,427 B2 | 7/2003 | Finot et al. | |
| 6,643,552 B2 | 11/2003 | Edell et al. | |
| 6,700,800 B2 | 3/2004 | Combs et al. | |
| 6,724,091 B1 | 4/2004 | Jayaraman et al. | |
| 6,797,882 B1 | 9/2004 | Crane, Jr. et al. | |
| 6,816,323 B2 | 11/2004 | Colin et al. | |
| 6,821,032 B2 | 11/2004 | Lake et al. | |
| 6,867,367 B2 | 3/2005 | Zimmerman | |
| 6,952,046 B2 | 10/2005 | Farrell et al. | |
| 6,977,187 B2 | 12/2005 | Farrell et al. | |
| 6,977,432 B2 | 12/2005 | Crane, Jr. et al. | |
| 6,999,649 B1 | 2/2006 | Chen et al. | |

OTHER PUBLICATIONS

Marc Finot, et al.,, "Automated Optical Packaging Technology for 10 Gb/s Transceivers and its Application to a Low-Cost Full C-Band Tunable Transmitter," Intel Technology Journal, vol. 8, Issue 02, pp.101-114, May, 2004.

(Continued)

*Primary Examiner*—Minsun Harvey
*Assistant Examiner*—Tod T Van Roy
(74) *Attorney, Agent, or Firm*—Marshall, Gerstein & Borun LLP (57) ABSTRACT

An external cavity laser apparatus includes a wavelength tuning element mounted to a carrier on the apparatus's platform. Thermal control of the platform sets an initial position of the carrier and tuning element, from which independent tuning of the element can be achieved for wavelength tuning. The carrier is formed of a liquid crystal polymer that thermally isolates the tuning element from this platform, for such independent thermo-optical tuning. The liquid crystal polymer may match the coefficient of thermal expansion of the carrier to that of the platform. The support further includes embedded electrodes, either within or on the outer surface of the carrier, which can couple from the tuning element to the controller, where in some examples such coupling is direct and without use of additional electrical traces or wire bonds.

17 Claims, 7 Drawing Sheets

OTHER PUBLICATIONS

B. Farrell et al., "The Liquid Crystal Polymenr Packaging Solution," Proc. IMAPS 2003 International Symposium, pp. 18-23, Boston, MA, Nov. 18-20, 2003.

Jauniskis, "Foster-Miller Liquid Crystal Polymer (LCP) Packaging Technology," Publication date unknown, available prior to Jun. 30, 2005 (2 pages).

Lowe, et al., "Liquid Crystal on Silicon (LCos) Micro-Display Packaging Standardization," Micro-Display 2001 [online]www.siliconbandwidth.com (pp 1-4).

LIQUID CRYSTAL POLYMER OPTICAL FILTER CARRIER

FIELD OF THE DISCLOSURE

Embodiments of the present disclosure relate generally to optoelectronic assemblies and, more particularly, to methods and apparatuses for supporting an optical element of laser apparatus.

BACKGROUND OF RELATED ART

Fiberoptic telecommunications are continually subject to demands for increased bandwidth. One way that bandwidth expansion has been accomplished is through dense wavelength division multiplexing (DWDM). A DWDM system is capable of simultaneously transmitting many different and separate data streams on a single optical fiber. Each data stream represents a different channel on the optical fiber, where each channel exists at a different channel wavelength. The modulated output beam of a laser operating at the desired channel wavelength creates the data stream. Multiple lasers, each at a different wavelength, are used to create multiple data streams, whereafter the data streams are combined onto a single fiber for transmission in their respective channels.

The International Telecommunications Union (ITU) presently requires channel separations of approximately 0.4 nanometers, or about 50 GHz. This channel separation allows up to 128 channels to be carried by a single fiber within the bandwidth range of currently available fibers and fiber amplifiers.

With the requirement for multiple tightly spaced channels, stable control over the laser source's output frequency is important to system effectiveness. The lasers used in DWDM systems typically have been based on distributed feedback (DFB) lasers operating with a reference wavelength tuning etalon in a feedback control loop, with the reference etalon defining the ITU wavelength grid. Due to manufacturing as well as performance limitations, DFB lasers are used as single channel lasers, or as lasers limited to tuning among a small number of adjacent channels. As a result, DWDM applications require multiple different DFB lasers each at a different channel wavelength.

Continuously tunable external cavity lasers have been developed to overcome the limitations of DFB lasers. These lasers have a gain chip media and an end mirror that define an external cavity within which wavelength tuning occurs, e.g., by thermal tuning operation. Tuning is somewhat difficult to achieve given the complexity of the tuning element. The carriers used to retain the tuning elements are complex structures, designed to provide sufficient thermal isolation. Tuning operation may be effected by the carrier's thermal responsiveness, as well as its structure and orientation. As a result, i complex carrier shapes have been proposed, but even these shapes are still too complex to build.

DETAILED DESCRIPTION OF AN EXAMPLE

Example embodiments described herein provide laser apparatuses and methods that use thermo-optic adjustment of an external laser cavity to provide wavelength stability and wavelength, i.e., frequency, tuning. The laser apparatuses may include a gain medium coupled to a platform, that gain medium having an emitting facet for emitting a first light beam toward the external laser cavity. The external laser cavity may have a wavelength selection device for wavelength tuning, for example, the channel wavelength in a DWDM system. The wavelength selection device may comprise an optical tuning element, including for example one or more etalons, gratings, prisms, filters or like devices, or various combinations thereof. The element may be thermally tunable to provide wavelength selective feedback to the gain medium. The element is coupled to a support that is mounted to the platform.

The support may be formed of a material having sufficient mechanical strength to allow the support to be mounted to the platform using optoelectronic device manufacturing techniques, such as pick-and-place assembly. For example, the support may be formed of a liquid crystal polymer (LCP). LCPs have the added advantage that their coefficients of thermal expansion (CTE) can be adjusted over a range of values. Thus, an LCP-material can be matched in CTE to the CTE of the platform upon which the support is mounted, as well as to the CTE of the tuning elements mounted. As discussed further below, using LCP in a support or carrier allows that support to be formed with embedded electrodes that couple to the tuning element and controller. These embedded electrodes may be easily formed within the support, and thus electrically isolated from other components.

Although, various techniques are described in reference to particular illustrated examples, the descriptions are not limited to these examples. Further, while drawings are provided for illustration purposes, it is noted that the apparatuses may vary as to configuration and as to details of the parts, and that the methods may vary as to details and the order of events, without departing from the basic concepts as disclosed herein. Furthermore, although examples are disclosed primarily in an external cavity laser, the examples are not limited thereto. Further, any definitions herein are provided for reason of clarity, and should not be considered as limiting, and any technical and scientific terms used herein are intended to have the same meaning as commonly understood by those skilled in the art. It should also be understood that the terminology used herein is for the purpose of describing particular embodiments only, and is not intended to be limiting.

Figure 1:
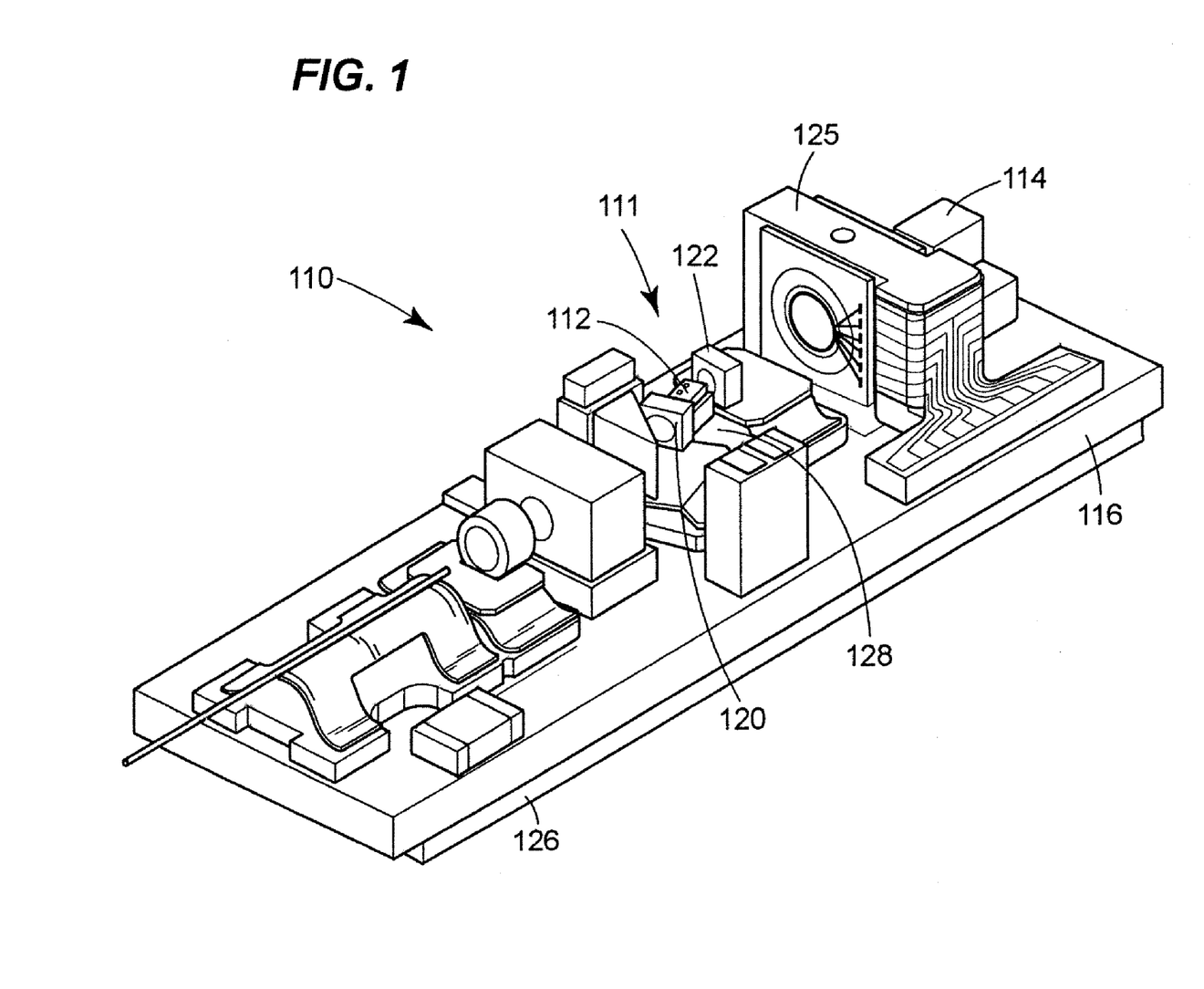
FIG. 1 illustrates a perspective view of a tunable laser apparatus with a wavelength selection device.

FIG. 1 shows a laser apparatus 110 capable of thermo-optic tuning. The apparatus 110 includes a laser device 111 with gain medium 112, and a reflective element 114 (e.g., an end mirror) both coupled to a thermally conductive base, or platform 116. The gain medium 112 may comprise, for example, a conventional Fabry-Perot diode emitter chip with an anti-reflection (AR) coated first facet (not shown) and a partially reflective second facet 120. The reflective element 114 though described as a mirror may comprise a mirror, grating, prism or other reflector or retroreflector. In the illustrated configuration, the external laser cavity extends from the first facet to the reflective element 114, and has an optical path length. Gain medium 112 emits a light beam from its first facet (closest to the reflective element 114) which is collimated by a lens 122 to define an optical path. The beam is reflected from end reflective element 114 and returned along the optical path to gain medium 112 by the lens 122.

A wavelength selection device 125 is positioned in the optical path to feed back light to the gain medium 112 at a selected wavelength thereby tuning the device. The reflective element 114 may be curved in certain embodiments such that lens 122 may be omitted. Other alternatives will be apparent to persons skilled in the art, including for example the use of a toric lens system or other optical element(s) capable of re-imaging the returning beam onto the first facet, so that gain medium 112 receives feedback from the external cavity, in place of lens 122.

The wavelength selection device 125 is mounted to the platform 116, which itself is coupled to a thermoelectric controller (TEC) 126 that controls the temperature of the entire platform 116 via thermal conduction. The TEC 126 therefore may control the temperature of the platform 116 for adjusting the optical path length of the laser apparatus 110 and thereby tuning the components of the apparatus 110. The wavelength selection device 125 may be tunable such that the apparatus 110 has a single transmission peak within a wavelength range of interest such as, for example, the gain bandwidth of gain medium 124, the wavelength range of the ITU (International Telecommunications Union) "C" band (approximately 192.1 THz to approximately 196.1 THz or approximately 1525 to approximately 1565 nanometers), or other wavelength range.

The thermally conductive platform 116 may be made from any thermally conductive material, examples of which include various metals, metal nitrides, carbides and oxides, or alloys, blends, mixtures or composites thereof, which provide materials with good thermal conductivity and relatively low CTE. Aluminum nitride (AlN) may be used as the platform material in certain embodiments. The material of platform 116 may be selected to have a particular CTE that allows CTE matching to components mounted thereto. In some embodiments, platform 116 may comprise a high CTE material, such as aluminum, copper, zinc or other metal or metal alloy, so that a desired amount of physical expansion and contraction according to temperature control of the TEC 126 may occur. A controller not shown may control operation of the TEC 126. The platform 116 may in certain embodiments be made of silicon, allowing CTE matching to silicon components such as thermally tuned etalons. The use of silicon for platform 116 also allows for the integration of conductor paths directly onto the platform 116, and formation of specific geometries on platform 116 using conventional silicon machining and fabrication techniques.

The gain medium 112 may be thermally coupled to platform 116 such that thermoelectric controller 126 can control the temperature of gain medium 112 by thermal conduction through the platform 116. "Thermal coupling" as used herein means any mounting or coupling arrangement or configuration that provides effective heat flow for thermal control of thermally coupled components. Gain medium 112, for example, may be mounted on a thermally conductive carrier 128 that may be coupled to platform 116, where the carrier 128 comprises a thermally conductive material such as a metal, metal oxide, metal nitride, metal carbide, or alloys, blends, mixtures or composites thereof. In other examples, the carrier 128 may comprises aluminum nitride, silicon carbide, or a silicon carbide blend (alloy). In yet other examples, carrier 128 may comprise a copper tungsten (CuW) alloy. Further still, the platform 116 and carrier 128 may be matched in CTE to each other and to gain medium 112. Thermally conductive adhesives or solders may be used to mount gain medium 112 onto carrier 128, and to mount carrier 128 and/or other various structures onto the platform 116.

The reflective element 114 may also be mounted on platform 116 as noted above and may, in certain embodiments, be thermally coupled to platform 116 using thermally conductive adhesives, solders and/or carriers or supports.

Figure 2:
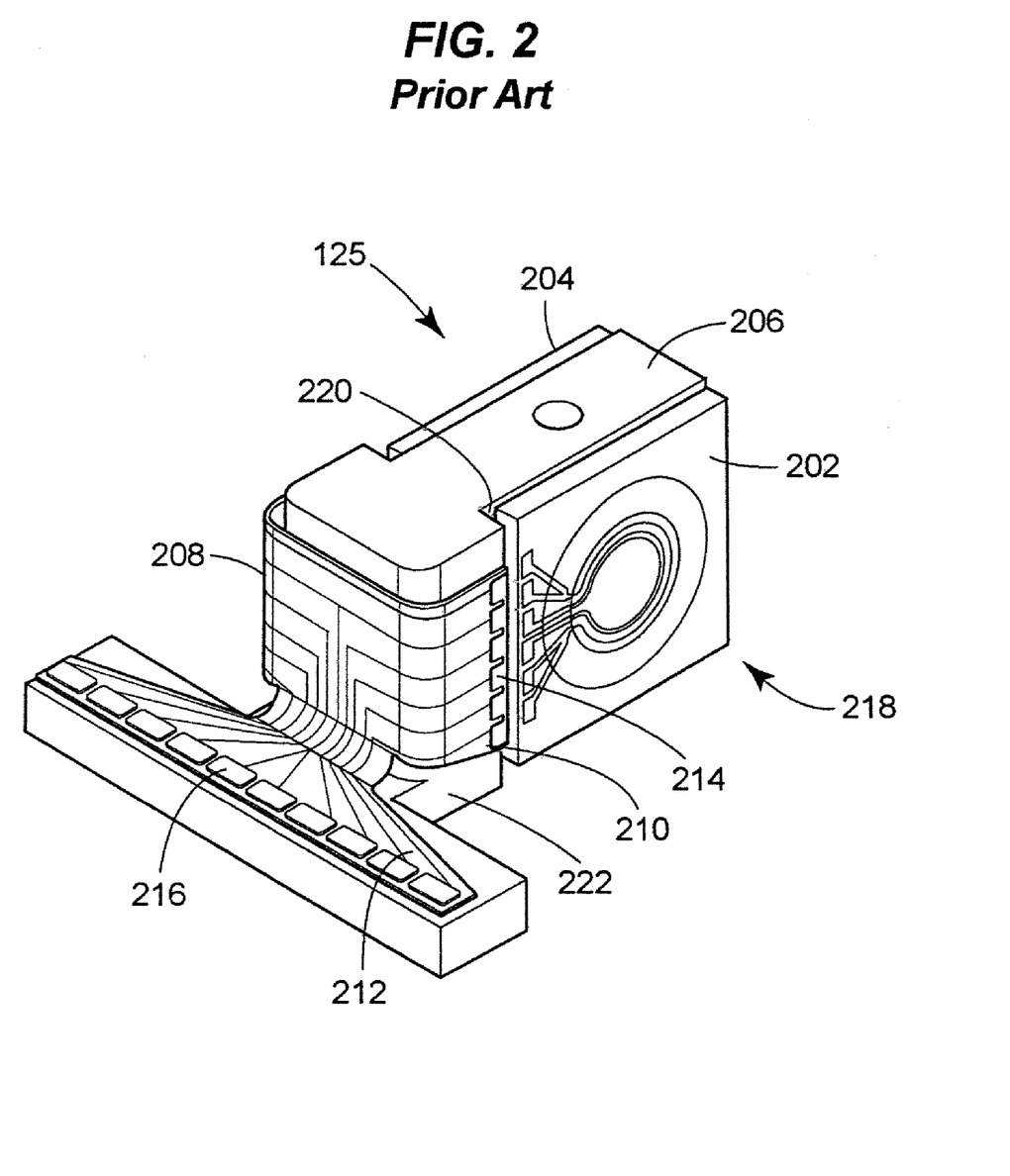
FIG. 2 illustrates a conventional support for a wavelength selection device having two thermally tunable etalons.

The wavelength selection device 125 is a conventional device. As shown in FIG. 2, the wavelength selection device 125 includes two optical elements in the form of etalons 202 and 204 mounted to a carrier 206 that is mounted directly to the TEC controllable platform 116.

The device 125 is formed of Invar™, a hardened Ni-Fe alloy. The etalons 202 and 204 are active in the illustrated example, having electrodes for heating and electrodes for temperature monitoring. To control these electrodes, a flex circuit 208 is used with a proximal end 210 adjacent the etalons 202 and 204 and a distal end 212. The end 210 has a plurality of exposed vertically, extending bond pads 214 for coupling to the etalon 202 (where similar wire bonds for the etalon 204 are hidden from view and not shown). The distal end 212 includes horizontal wire bond pads 216 for coupling to a controller. These orientations are general in nature, but an advantage to having a horizontal flex circuit mounting at least over a portion of the flex circuit 208 is that a pick-and-place manufacturing processes may be used to affixed wires thereto.

The carrier 206 has a mounting end 218 when the etalons 202 and 204 are mounted, the mounting end have a recessed mounting face 220 (only one being visible). A flex circuit platform 222 extends outwardly from the mounting face 220 and supports the proximal end 210 of the flex circuit 208. This platform 222 extends vertically, in the illustrated example, and is thermally coupled to a horizontally-extending platform 224 that supports the distal end 212.

Figure 3:
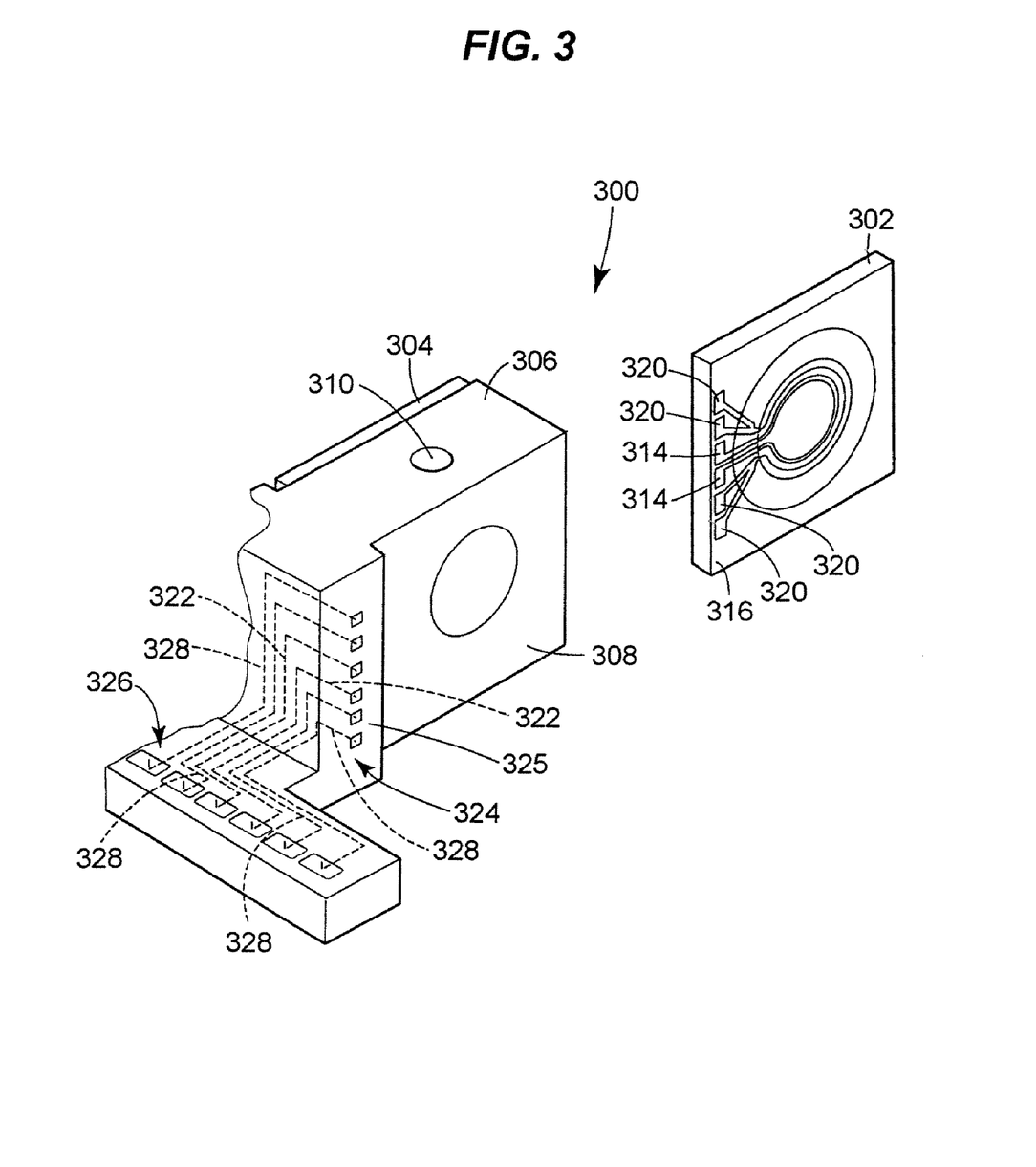
FIG. 3 illustrates a support configuration for a wavelength selection device showing embedded electrodes, in accordance with a present example.

The flex circuit of the conventional device in FIG. 2 is external to the carrier 206, adding to fabrication time and complexity, as well as adding a manufacturing step, that of mounting the flex circuit to the support. FIG. 3 illustrates an example wavelength selection device 300 in accordance with a present example. The device 300 does include two etalons 302 and 304, both of which are mountable to a carrier 306. Etalon 302 is shown prior to mounting to illustrate details of the carrier 306. In the illustrated example, the carrier 306 includes a mounting surface 308 upon which the first etalon 302 may be mounted (with a similar mounting surface for the etalon 304). The mounting surface 308 may be tilted from normal such that the etalon 302 tilts 1° to 2° inward, toward fiducial 310 for tilting the etalon 302 in the pitch direction to reduce surface reflection, as will be known to persons skilled in the art. An optical cavity 312 is formed extending from the surface 308 to the opposing mounting surface, which may also be tilted toward fiducial 310. The laser beam travels through this optical cavity 312.

The etalon 302 is an active tuning element with electrodes for thermo-optic tuning. In the illustrated example, heating electrodes 314 extend from an edge 316 of etalon 302 to define a heater centered around an optical transmission region 318. Electrodes 320 extend from the edge 316 to region 318 as well, but to form a monitoring element, e.g., a resistive thermal device (RTD), used in feedback loop control of temperature tuning.

To connect to these electrodes, the support 306 includes a series of embedded electrodes, which in the illustrated example are embedded below the outer surface of the substrate 306. Embedded electrodes 322 extend from a first bond pad 324 to a second bond pad 326. The bond pad 324 is formed on an outer surface of a platform 325 that extends outwardly from the mounting surface 308. The bond pad 324 may be used to couple the electrodes 322 to the heater electrodes 314, while the bond pad 328 may be used to couple to a controller. Similarly, embedded electrodes 328 extend from the pad 324 to the pad 326 and are coupled to the monitoring electrodes 320.

The pads 324 and 326 are wire bond pads, in the illustrated example, for connecting wire bonds between pad electrodes and the etalon. Although electrodes are described for coupling to etalon 302, it will be appreciated that the support 306 would have additional electrodes for coupling to the etalon 304, in a similar manner. By embedding the electrodes 322 and 328 within the support 306, greater electrical isolation may be achieved along with faster and more accurate fabrication times. Further, the flex circuit mounting step has been removed.

The embedded electrodes 322 and 328 extend in three dimensions, in the illustrated example, which can allow for a support having a complex structure shape. A support can be formed to support and provide electrical leads to other structures, such as dither optical path length adjusters or the laser gain medium itself. A single bonding pad could be used to couple to a controller, while embedded electrodes would extend from the bonding pad to the other element(s).

The etalon materials used in certain embodiments have temperature dependent refractive indices as well as coefficients of thermal expansion such that thermo-optic tuning may involve simultaneous thermal control of etalon material refractive index as well as thermal control of etalon physical thickness by selective heating or cooling. Semiconductor materials such as silicon and gallium arsenide provide a large change in refractive index with temperature and may be used for the material etalons for effective thermo-optic tuning. In some examples, the etalons 302, 304 may comprise silicon, which is transparent over the gain bandwidth or output wavelength range of InGaAs, InGaAsP and other gain media. Other materials include liquid crystal polymers (LCPs), or materials formed of inert, no-hydroscopic materials. The etalons 302, 304 may be affixed to the substrate 306 by any epoxy, solder, or other adhesive.

Figure 4:
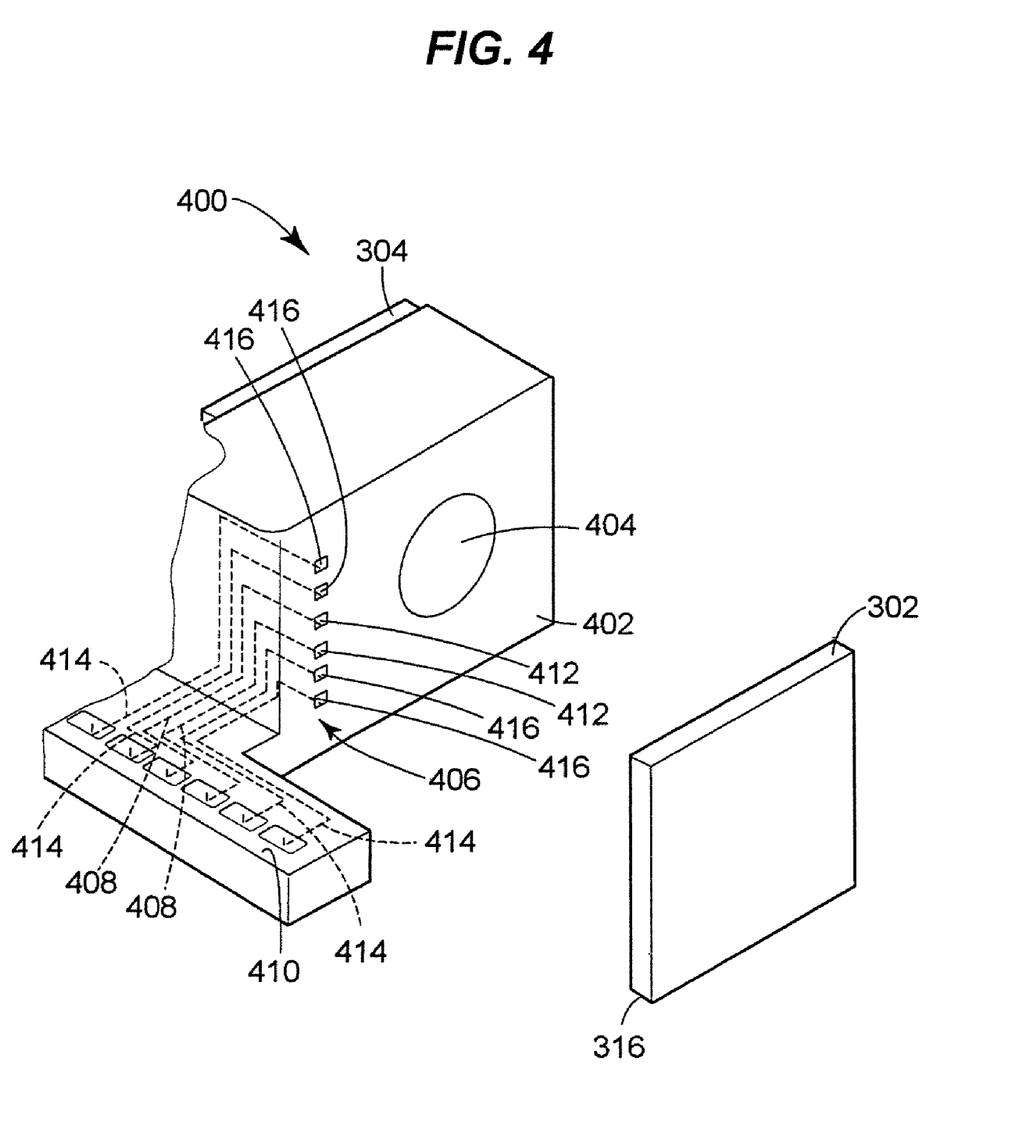
FIG. 4 illustrates another support configuration for a wavelength selection device with embedded electrodes that may directly couple to an active tuning element.

FIG. 4 shows another example of a support with embedded electrodes. Support 400 is similar to support 300 having a mounting surface 402 from which an optical cavity 404 extends. The support 400, however, has electrodes embedded for direct contact with the etalon 302 on the mounting surface 402. An etalon pad 406 is positioned on the surface 402 at an edge 408 that coincides with the edge 316 of the etalon 302. Thus, the etalon 302 may be directly mounted on the mounting surface 402 making direct electrical contact with the pad 406. Embedded electrodes 408 extend from a pad 410 to electrode pad 412 that form a direct electrical connection with the electrodes 314 of the etalon 302. Embedded electrodes 414 are coupled to electrode pads 416 that form a direct electrical connection with the electrodes 320 of the etalon 302. Thus, the extra fabrication step of wire bonding on the optical tuning element may be eliminated.

To provide them with embedded electrodes, the carriers 306 and 400 may be formed of a liquid crystal polymer (LCP) material. LCP materials have molecules that can be organized in crystalline lattice structure form, but that can also be poured into a casting or mold in a liquid state, prior to crystallization. As crystalline structures, LCP materials offer mechanical stability and accurate edges and dimensions during manufacturing. LCP materials have low moisture absorption (typically, <0.04% weight) and in general are not susceptible to atmospheric conditions. Thus, they may be used in environments of various atmospheric compositions and pressures. LCP materials also have the advantage that their CTEs are adjustable over a range of values. As such, the thermal responsiveness of tuning element carriers can be tailored to match that of the particular mounting platform in the laser apparatus. Typical platform materials include copper, which has a CTE of approximately 17 PPM/°K, or glass, ceramic, Kovar™ (an iron alloy) which have CTEs around approximately 7 PPM/°K. LCP can be tailored to have a CTE of any where from 0-30 PPM/°K or higher by using different monomers in forming the LCP and by using different formation process conditions. This flexibility allows the carrier to be formed of a material having a CTE that matches the CTE of the optical tuning element as well. An LCP carrier can be formed to have CTEs over any desired range, including below 10 PPM/°K, below 20 PPM/°K, and above 30 PPM/°K.

Carriers may be formed of LCP via injection molding of a liquid state LCP into a casting where electrodes are pre-positioned using a feedthrough in the casting. Embedding of the electrodes, whether subsurface or on surface may be achieved through the use of pre-positioned electrodes or via insertion during the LCP molding process. Plating techniques may be used as well to form electrodes on patterned recesses on the outer surface of the molding.

Figure 5A:
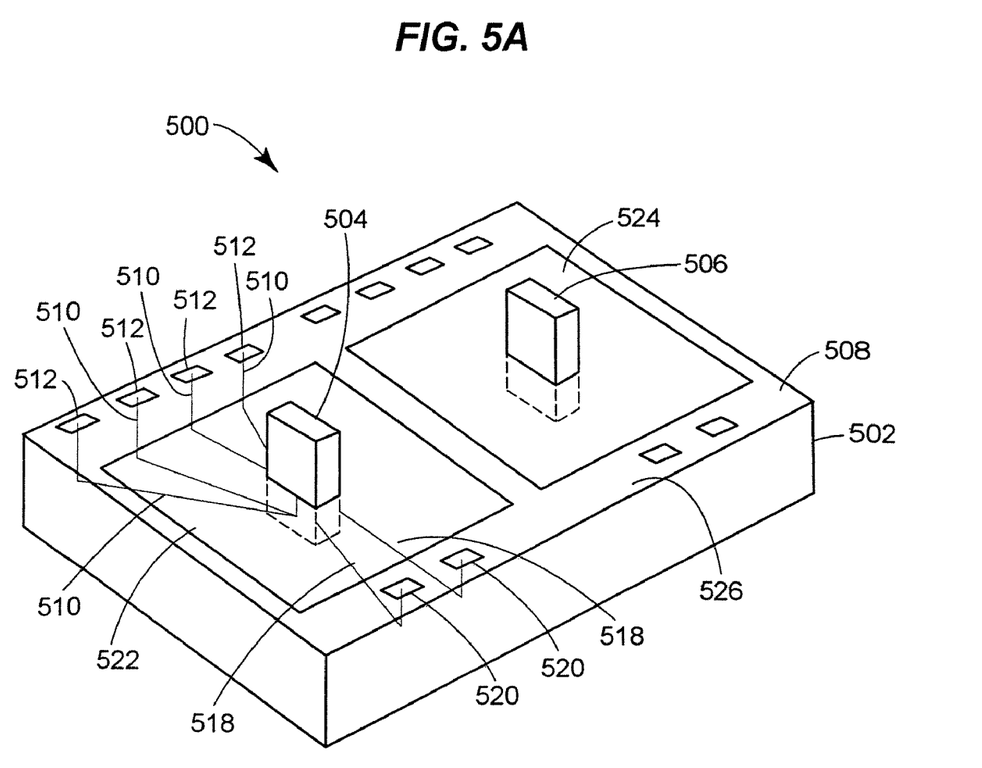
FIGS. 5A and 5B illustrate another example support configuration for a wavelength selection device.
Figure 5B:
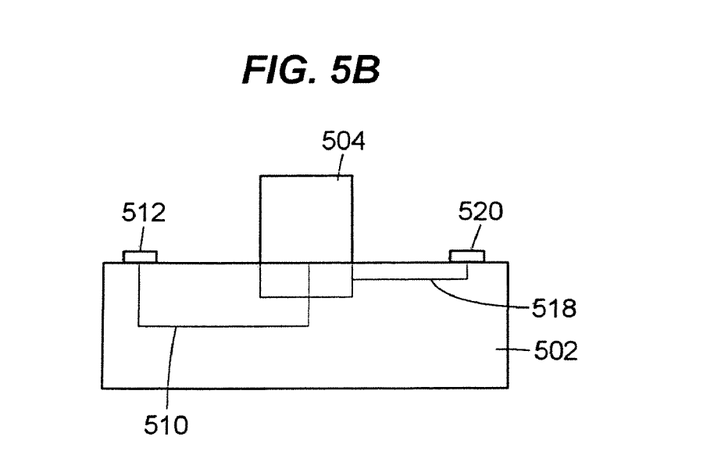

FIGS. 3 and 4 show carriers that extend coplanarly with the optical tuning element, e.g., vertically extending. This disclosure is not limited to a particular configuration, however. Wavelength selection devices may include horizontal planar supports with embedded electrodes defining heating and monitoring regions for optical tuning elements extending vertically from the support. For example, a wavelength selection element 500 having a substrate 502 and two etalons 504, 506 extending from an upper surface 508 thereof is shown in FIGS. 5A and 5B. The substrate 502 has embedded monitoring electrodes 510 that extend three-dimensionally through the substrate 502. In this example illustration, the electrodes 510 extend from a monitoring region at the etalon 504 to wire bond pads 512 on the upper surface 508 for coupling to a controller. Similarly, electrodes 518 extend from a heating region around the etalon 504 to a wire bond pad 520. Each of the etalons 504 and 506 is mounted in a separate thermally responsive region 522, 524 respectively. These regions 522, 524 are thermally isolated by a thermal barrier 526 to allow for independent thermo-optic tuning of each. FIG. 5B shows a front view of the device 500 showing internal features of the electrodes 510, 518 and the etalon 504 to show that electrodes can be formed extending in three dimensions through a monolithic or single substrate, with out limiting these electrodes to particular planar fabrication lasers, as is done with substrates formed by typical semiconductor processing techniques. By using LCP for the substrate 502, embedded electrodes can be formed without limitation to shape, position, depth or thickness.

Figure 6A:
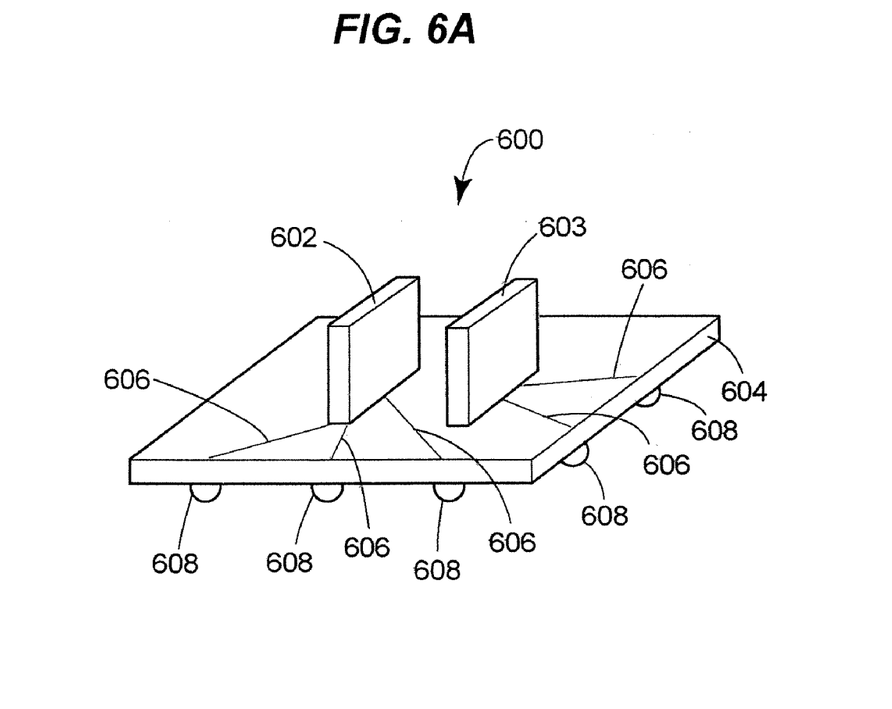
FIGS. 6A and 6B illustrate an example of an optical component having embedded waveguides in accordance with an example herein, and for use in a ball grid array application.

FIG. 6A illustrates yet another example, a flip-chip mountable optical device 600 that is a wavelength selection device, in the illustrated example. The device 600 includes two optical filters 602 and 604 each mounted in a substrate 604 that may be formed of a LCP or other material. The substrate 604 includes embedded electrodes (each generally referenced as electrode 606). In the illustrated example, each electrode 606 is coupled to a ball of a ball grid array (BGA) 608 that may be formed on an undersurface of the substrate 604, for example at locations coinciding with via holes extending through the substrate 604 for engaging the electrodes 606. The substrate 604 may be a single LCP material with embedded electrodes 606 or it may represent a multilayered structure, e.g., having different LCP layers and having different electrodes (e.g., heating electrodes and temperature monitoring electrodes) in the different layers. The BGA 608 may be formed of known BGA conductor materials and may be patterned for marrying with a mounting substrate.

Figure 6B:
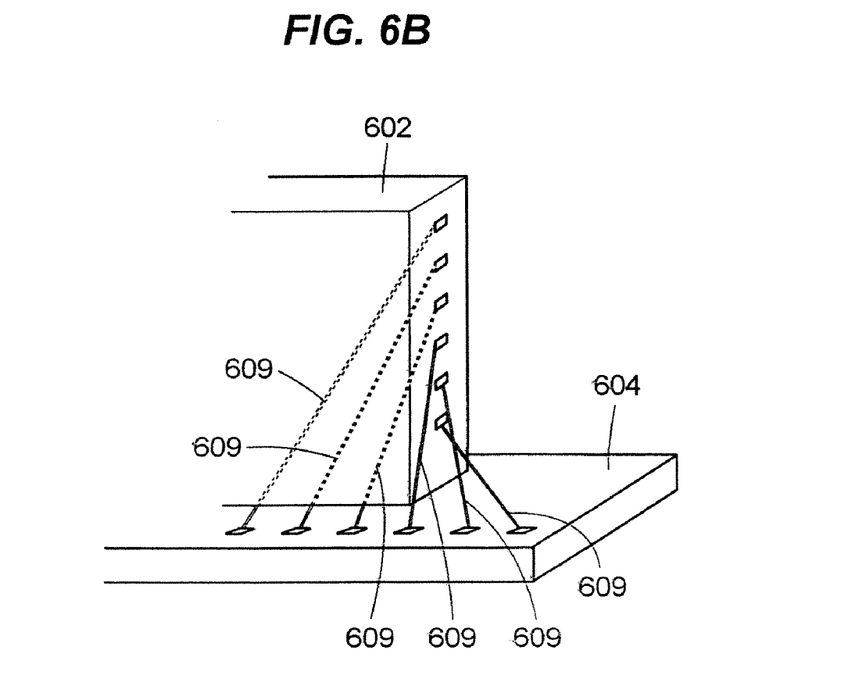

In the example of FIG. 6A, the substrate 604 of the device 600 contains electrodes for controlling the thermal control. As such the substrate 604 may be formed of LCP, for example. FIG. 6B shows a wire frame 609 extending downward from one of the filters 602 to the substrate 604.

Figure 7:
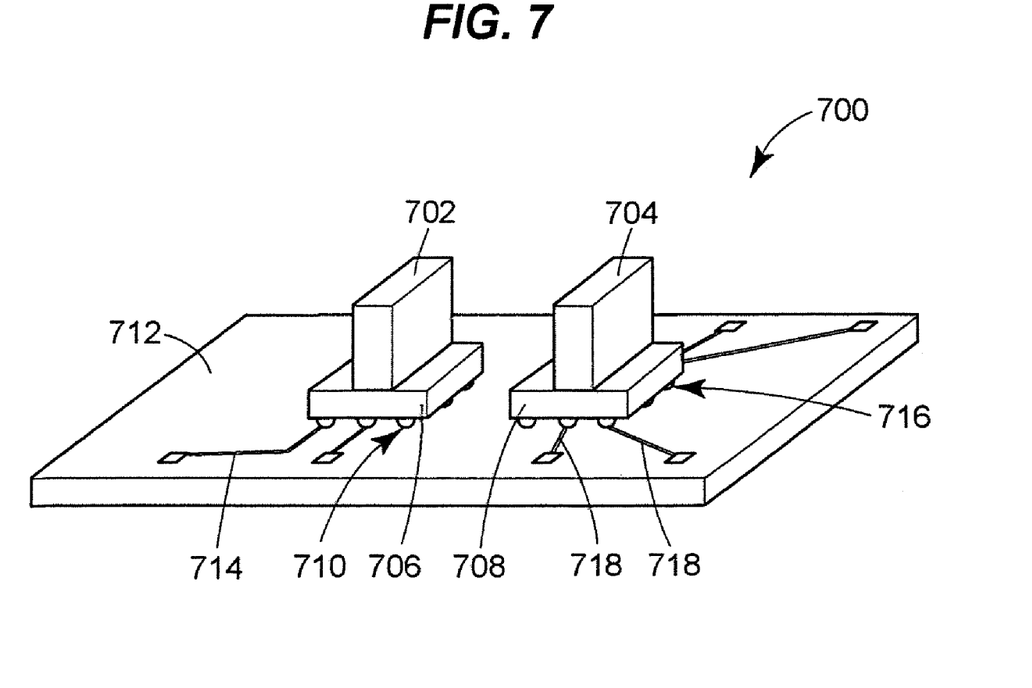
FIG. 7 illustrates another example of an optical component in a ball grid array application, but with embedded electrodes in a support for two substrates.

FIG. 7 illustrates another example implementation of a flip-chip device 700. The device 700 includes two tuning filters 702, 704, e.g., etalons, each mounted on a separate substrates 706, 708 respectively. Substrate 706 includes a BGA 710 for electrically coupling the substrate 706 to an integrated support 712. In the illustrated example, the support 712 may be formed of a LCP and include embedded electrodes 714 for coupling the support for heating, monitoring, and any other desired uses. The substrate 708 includes a BGA 716 for coupling the substrate 708 to integrated support 712 and more particularly embedded electrodes 718 of the support 712.

Figure 8:
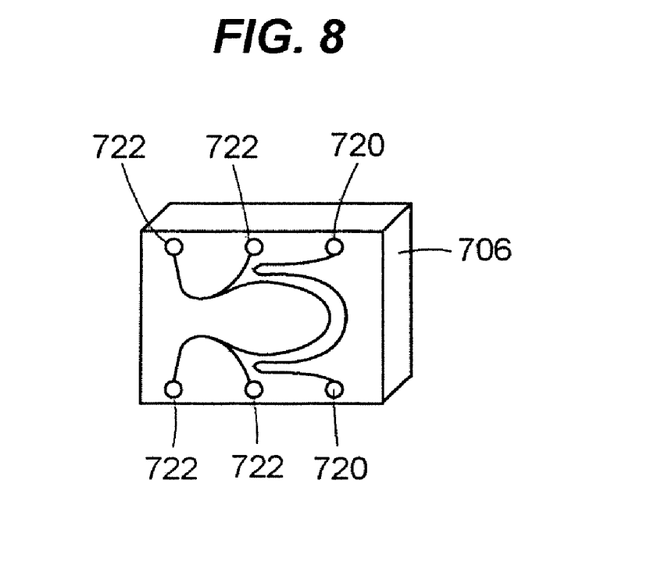
FIG. 8 illustrates a detailed view of an example of a substrate that may be used in the example of FIG. 7.

FIG. 8 illustrates an example of the substrate 706, showing heating electrodes 720 and four monitoring electrodes 722. The electrodes 720 and 722 surround a mounting region for the filter 702. The substrate 706 may be a Silicon substrate for example, and the electrodes 720 and 722 embedded electrode traces coupled to the BGA 710. Substrate 708 would have a similar configuration. The BGAs of each substrate couple to electrodes on the support 712 for coupling to controller for the laser apparatus, e.g., a wavelength selection device controller.

Various examples above describe Fabry-Perot etalons, which may comprise parallel plate solid, liquid or gas spaced etalons, and which may be tuned by precise dimensioning of the optical thickness or path length. Etalons are illustrated by way of example. Fewer, additional and/or other optical elements may be used in the wavelength selection device, such as for example, gratings, prisms, thin film interference filters, or other tunable elements.

In the illustrated examples, the etalons are thermo-optically tunable, where the term "thermo-optic" tuning means tuning by temperature-induced change in etalon material refractive index, temperature induced change in the physical thickness of an etalon, or both. Various tuning mechanisms involving various techniques may be used, however, including thermo-optic, electro-optic, acousto-optic, piezo-optic, mechanical, or other tuning to vary refractive index of etalon material and/or vary the spacing of etalon faces.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalence.

I claim:

1. A laser apparatus comprising:
   a platform;
   a gain medium coupled to the platform, the gain medium having a first output facet and a second output facet to emit a light beam from in response to an electrical input;
   a reflector positioned to reflect the light beam and coupled to the platform, the reflector and the first output facet defining a laser cavity having an optical path length; and
   an electrically controllable wavelength selection device disposed within the laser cavity, the electrically controllable wavelength selection device having a tunable optical element mounted to a support coupled to the platform, wherein the support is formed of a liquid crystal polymer and is coupled to the platform such that the tunable optical element extends orthogonally from an upper surface of the support into the laser cavity, wherein the tunable optical element is mounted to a thermally responsive region of the support, wherein the support includes at least one embedded electrode for electrically controlling the thermally responsive region of the wavelength selection device.

2. The laser apparatus of claim 1, wherein the coefficient of thermal expansion for the platform is substantially the same as the coefficient of thermal expansion for the support.

3. The laser apparatus of claim 2, wherein the coefficient of thermal expansion of the platform and the coefficient of thermal expansion of the support are less than 10 PPM/°C.

4. The laser apparatus of claim 2, wherein the coefficient of thermal expansion of the platform and the coefficient of thermal expansion of the support are less than 20 PPM/°C.

5. The laser apparatus of claim 2, wherein the coefficient of thermal expansion of the platform and the coefficient of thermal expansion of the support are greater than 30 PPM/°C.

6. The laser apparatus of claim 1, wherein the at least one embedded electrode is coupled to a contact on the upper surface.

7. The laser apparatus of claim 6, further comprising a plurality of embedded electrodes and a plurality of contacts on the surface, each of the plurality of embedded electrodes coupled to a respective one of the plurality of contacts.

8. The laser apparatus of claim 1, wherein the electrically controllable wavelength selection device includes the tunable optical element and another tunable optical element mounted to another thermally responsive region of the support and extending orthogonally from the upper surface into the laser cavity, where the thermally responsive region and the another thermally responsive region are capable of having different thermal characteristics, the support having a plurality of embedded electrodes for separately controlling the tunable optical element and the another tunable optical element.

9. The laser apparatus of claim 8, wherein the first thermal region and the second thermal region are separated by a thermal barrier.

10. The laser apparatus of claim 9, wherein the tunable optical element is mounted in a recess in the thermally responsive region of the support and wherein the another tunable optical element is mounted in a recess in the another thermally responsive region.

11. The laser apparatus of claim 8, wherein the tunable optical element comprises a first etalon and the another tunable optical element comprises a second etalon.

12. The laser apparatus of claim 1, wherein the support is a flip-chip mountable substrate having the tunable optical element on a first side of the support and a ball grid array on a second, opposite side of the support.

13. The laser apparatus of claim 1, wherein the tunable optical element is mounted in a recess in the thermally responsive region of the support.

14. The laser apparatus of claim 13, wherein the at least one embedded electrode comprises at least one electrode for heating the thermally responsive region and at least one electrode for monitoring the thermally responsive region.

15. The laser apparatus of claim 14, wherein the at least one embedded electrode for heating the thermally responsive region and at least one electrode for monitoring the thermally responsive region are embedded in the support extending different depths below the upper surface.

16. The laser apparatus of claim 13, wherein the at least one embedded electrode is terminated in the thermally responsive region below the upper surface of the support.

17. The laser apparatus of claim 1, wherein the at least one embedded electrode comprises a plurality of monitoring electrodes extending in different directions embedded within the support and a plurality of heating electrodes extending in different directions embedded within the support.

* * * * *